United States Patent
Choi et al.

(10) Patent No.: US 10,264,666 B2
(45) Date of Patent: Apr. 16, 2019

(54) METHOD OF PROVIDING COMPARTMENT EMI SHIELDS ON PRINTED CIRCUIT BOARD USING A VACUUM

(71) Applicant: Avago Technologies General IP (Singapore) Pte. Ltd., Singapore (SG)

(72) Inventors: Deog Soon Choi, Seoul (KR); Ah Ron Lee, Seoul (KR)

(73) Assignee: Avago Technologies International Sales Pte. Limited, Singapore (SG)

( * ) Notice: Subject to any disclaimer, the term of this patent is extended or adjusted under 35 U.S.C. 154(b) by 438 days.

(21) Appl. No.: 15/187,617

(22) Filed: Jun. 20, 2016

(65) Prior Publication Data

US 2017/0367225 A1    Dec. 21, 2017

(51) Int. Cl.
| | |
|---|---|
| *H05K 3/00* | (2006.01) |
| *H05K 1/02* | (2006.01) |
| *H05K 3/28* | (2006.01) |

(52) U.S. Cl.
CPC ......... *H05K 1/0216* (2013.01); *H05K 3/0032* (2013.01); *H05K 3/285* (2013.01); *H05K 3/284* (2013.01); *H05K 2201/0133* (2013.01); *H05K 2201/0715* (2013.01); *H05K 2203/085* (2013.01)

(58) Field of Classification Search
CPC .... H05K 1/0216; H05K 3/0032; H05K 3/284; H05K 2203/085; H05K 2201/0133; H05K 2201/0715
See application file for complete search history.

(56) References Cited

U.S. PATENT DOCUMENTS

| | | | |
|---|---|---|---|
| 7,497,366 B2 | 3/2009 | Chey et al. | |
| 9,320,183 B1* | 4/2016 | Nagar | H05K 9/0007 |
| 2010/0314041 A1* | 12/2010 | Ng | H05K 3/101 156/278 |
| 2014/0085857 A1 | 3/2014 | Chen et al. | |
| 2015/0043172 A1* | 2/2015 | Mugiya | H05K 1/0218 361/728 |
| 2015/0070849 A1* | 3/2015 | Shimamura | H05K 1/0216 361/728 |

* cited by examiner

*Primary Examiner* — Paul D Kim

(57) ABSTRACT

A method is provided for forming an internal electromagnetic interference (EMI) shield in a mold cap formed over a printed circuit board (PCB). The method includes forming a trench in the mold cap, the trench extending continuously from a first edge of the mold cap to a second edge of the mold cap, where the trench defines a trench pattern corresponding to desired locations of the internal EMI shield. The method further includes sealing an elastomeric pad on a top surface of the mold cap to form a channel, the channel including at least the trench formed in the mold cap; and filling the channel with a conductive epoxy using a vacuum configured to draw the conductive epoxy from a dispenser, connected to the first edge of the mold cap, through the channel to the second edge of the mold cap based on pressure differential.

20 Claims, 9 Drawing Sheets

METHOD OF PROVIDING COMPARTMENT EMI SHIELDS ON PRINTED CIRCUIT BOARD USING A VACUUM

BACKGROUND

Electronic circuits are commonly provided on and within a printed circuit board (PCB), which is covered by a protective molded compound or mold cap. The combined PCB and mold cap may be divided, or singulated, into separate solid state circuit packages, which may be covered with external shields to form discrete shielded packages, referred to as "modules" or "shielded modules." The modules include electronic components for various electronic devices. The external shields typically comprise layers of conductive material, such as copper or other metal, that cover the tops and sidewalls of the modules (while the bottoms of the modules are protected by the PCB substrate). The external shields protect the electronic components within the modules from electromagnetic interference (EMI) caused by externally generated electromagnetic radiation, and from environmental stresses, such as temperature, humidity (e.g., hermetic sealing), and physical impact, for example.

Notably, decreasing distances between electronic components within each module tend to lead to EMI among these electronic components, caused by internally generated electromagnetic radiation, causing performance degradation. The external shield provides no shielding of the electronic components from internally generated electromagnetic radiation, including capacitive and inductive coupling and other cross-talk, for example. Indeed, the external shield, in some cases, may aggravate the electromagnetic interference by reflecting the internal electromagnetic radiation back toward the electronic components within the module. Therefore, internal EMI shields may be formed around all or part of an electronic component to provide protection from the internally generated electromagnetic radiation. An internal EMI shield that surrounds (or partially surrounds) one or more electronic components within a module may be referred to as a "compartment EMI shield." A compartment EMI shield typically extends from a top surface of the PCB to a bottom surface of the external EMI shield, effectively creating a wall of shielding material internal to the module, protecting the one or more electronic components within the compartment formed (at least in part) by the compartment shield.

Using conventional techniques, compartment EMI shields, as well as other internal EMI shields configured to provide EMI barriers among electronic components within a module, are difficult and time consuming to implement, which tends to increase fabrication cost. For example, EMI shields may be formed using dispensing needles, which inject conductive epoxy into the top of the mold cap, in a piecemeal manner, where the epoxy ejections collectively form the EMI barrier. However, as mentioned above, this technique is time consuming since numerous, singular injection may be required. Also, the resulting EMI shield is likely to have some defects, such as epoxy dimples, voids and/or overflow, particularly after the epoxy is exposed to heat for curing (oven cured).

FIGS. 8A, 8B and 8C are cross-sections of mold caps showing examples of typical conductive epoxy defects in a portion of an internal EMI shield, e.g., formed using dispensing needles. FIG. 8A shows an epoxy dimple 810, which is a concave surface of the epoxy (which may be subsequently filled with the external EMI shield material), typically caused by shrinkage of the epoxy during oven curing. FIG. 8B shows an epoxy void 820, which is an opening in the middle section of the epoxy, typically caused by incomplete injection of the epoxy using the dispensing needle and/or shrinkage of the epoxy during oven curing. FIG. 8C shows epoxy overflow 830, which involves the epoxy overflowing the hole in the mold cap created by the dispensing needle, typically caused by an excess amount of epoxy being injected into the mold cap. As further shown in FIGS. 8B and 8C, the epoxy void 820 and the epoxy overflow 830 may also be accompanied by epoxy dimples 822 and 833, respectively, due to shrinkage of the epoxy that remains in the dispensing needle hole during oven curing.

Accordingly, there is a need for enhanced internal EMI shields among and between electronic components within solid state circuit packages, and improved fabrication techniques for achieving the enhanced internal EMI shields.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements throughout the drawings and written description.

DETAILED DESCRIPTION

Figure 1A:
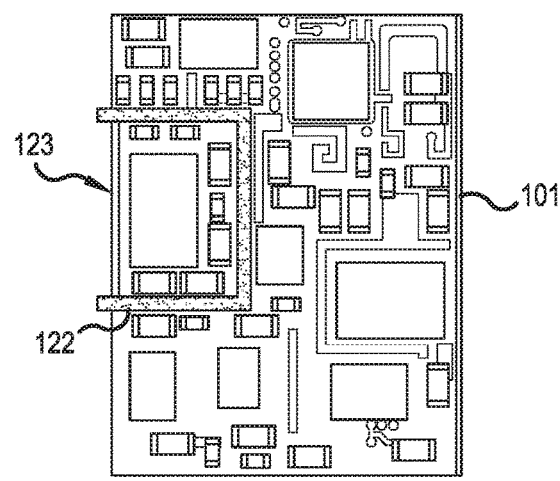
FIG. 1A is a top plan view of a solid state circuit package including an illustrative internal electromagnetic interference (EMI) shield, formed according to a representative embodiment.

In the following detailed description, for purposes of explanation and not limitation, example embodiments disclosing specific details are set forth in order to provide a thorough understanding of the present teachings. However, it will be apparent to one of ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a", "an" and "the" include both singular and plural referents, unless the context clearly dictates otherwise. Thus, for example, "a device" includes one device and plural devices. The terms "substantial" or "substantially" mean to within acceptable limits or degree to one of ordinary skill in the art. The term "approximately" means to within an acceptable limit or amount to one of ordinary skill in the art. Relative terms, such as "above," "below," "top," "bottom," "upper" and "lower" may be used to describe the various elements" relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

Compartmental shielding of individual or sets of electronic components in a solid state package (or module) minimizes EMI issues. In various representative embodiments, a pressure differential (e.g., created by a vacuum) is used to efficiently form one or more electrically conductive compartment EMI shields at least partially around individual or sets of electronic components. That is, conductive epoxy is drawn through continuous trenches formed in a mold cap that covers a printed circuit board (PCB) (and in certain configurations, additionally through grooves formed in an elastomeric pad that covers the mold cap), which includes the solid state package prior to singulation, from a high pressure side to a low pressure side (e.g., vacuum) of the mold cap. This method reduces time for fabricating the EMI shields, and reduces or eliminates defects in the conductive epoxy after curing.

For example, according to a representative embodiment, a method of forming an EMI shield in a mold cap formed over a PCB is provided. The method includes forming a trench in the mold cap, the trench extending continuously from a first edge of the mold cap to a second edge of the mold cap, where the trench defines a trench pattern corresponding to desired positions locations of the internal EMI shield; sealing an elastomeric pad on a top surface of the mold cap to form a channel, the channel including at least the trench formed in the mold cap; and filling the channel with a conductive epoxy using a vacuum configured to draw the conductive epoxy from a dispenser, connected to the first edge of the mold cap, through the channel to the second edge of the mold cap based on pressure differential.

Figure 1B:
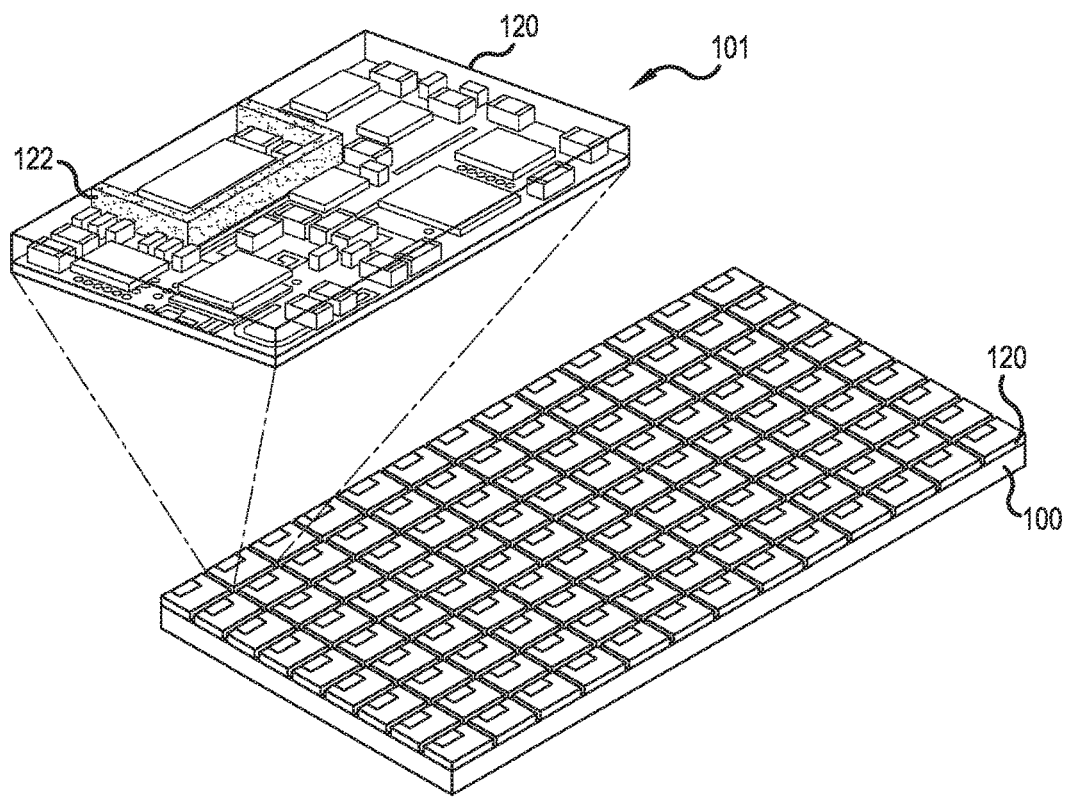
FIG. 1B is an exploded view of the solid state circuit package shown in FIG. 1A, located in a printed circuit board (PCB) prior to singulation.

FIG. 1A is a top plan view of a solid state circuit package including an illustrative EMI shield, formed according to a representative embodiment, and FIG. 1B is an exploded view of the solid state circuit package shown in FIG. 1A, located in a PCB prior to singulation.

Referring to FIGS. 1A and 1B, a PCB 100 includes multiple solid state circuit packages, including illustrative solid state circuit package 101, having various electronic components and circuitry. The solid state circuit packages are fabricated within and/or assembled on the PCB 100 according to any technique compatible with PCB and solid state circuit package fabrication, as well as the specific design requirements. The PCB may be formed of any material compatible with semiconductor processes, such as silicon (Si), gallium arsenide (GaAs), indium phosphide (InP), glass, sapphire, alumina, epoxy, bismaleimide triazine (BT), prepreg composites, reinforced or non-reinforced polymer dielectrics and the like, for example, and may include embedded circuitry and a ground plane, e.g., on a bottom surface of the substrate. Further details of the formation the PCB 100 are not discussed herein for the sake of brevity, since the various embodiments are not affected by the components and formation of the PCB 100, other than with respect to the desired locations of the internal EMI shields.

Notably, the PCB 100, including the singulated solid state circuit package 101, is covered with a mold compound, referred to as a or mold cap 120, which may be formed of a reinforced or non-reinforced epoxy resin, for example, and may be applied using any process compatible with fabrication of semiconductor devices, such as injection molding, transfer molding, or compression molding, for example. The mold cap 120 generally protects the electronic components assembled on the PCB 100 and provides additional structural support and stability. The mold cap 120 may also hermetically seal the PCB 100.

FIG. 1A shows one of the solid state circuit packages, solid state circuit package 101, which includes an illustrative internal EMI shield 122. In the depicted example, the internal EMI shield 122 is an internal compartment EMI shield in that it separates (compartmentalizes) a set of electronic components 123, such as surface mount technology (SMT) devices, flip-chip devices and/or bond wire devices, for example, arranged on a surface of the PCB 100. In the depicted example, the internal EMI shield 122 forms three sides of a rectangle arranged between the set of electronic components 123 and the other electronic components of the solid state circuit package 101. The fourth side would be formed by an external EMI shield (not shown) comprising a layer(s) of conductive material formed over the solid state circuit package 101 to form a solid state module, as discussed below with reference to FIG. 6B, for example. This is because of the location of the solid state circuit package 101 on an edge of the PCB 100, as shown in FIG. 1B. Another solid state package located in a center portion of the PCB 100 (and surrounded on all sides by other solid state packages) would have an internal EMI shield located on all four sides of the area in which the set of electronic components are located, as would be apparent to one of ordinary skill in the art.

Figure 2:
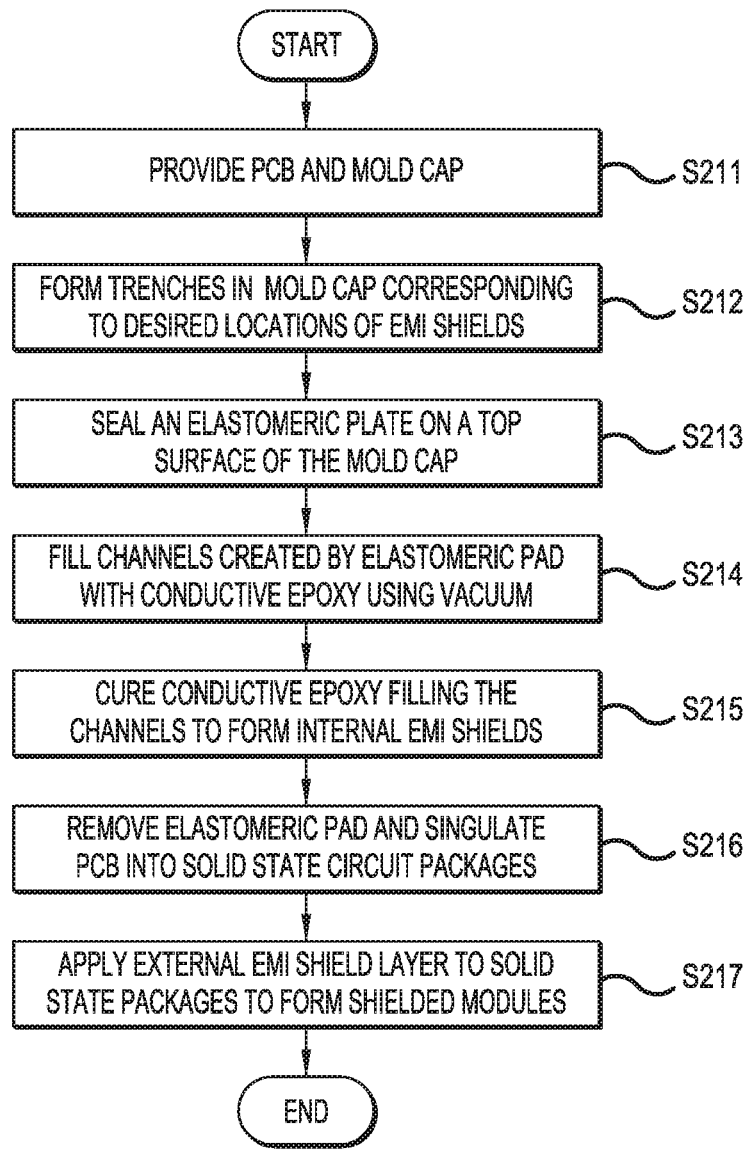
FIG. 2 is a flow diagram of a method of fabricating solid state modules with internal EMI shields formed in mold caps, according to a representative embodiment.

FIG. 2 is a flow diagram of a method of fabricating solid state modules with internal EMI shields formed in mold caps, according to a representative embodiment. The depicted method is directed to fabricating compartment EMI shields, such as the illustrative internal EMI shield 122 in FIG. 1A, although it is understood that the steps may apply to other types of internal EMI shields that may be formed in a PC B mold cap.

Referring to FIG. 2, a PCB with a mold cap is provided in block S211, where the mold cap covers a top surface of the PCB, as well as any circuitry and/or electronic components that may be on the top surface of the PCB. In an embodiment, the top surface of the PCB is formed of a conductive material, such as copper (Cu) or other metal. The PCB includes multiple solid state circuit packages, as discussed above with respect to PCB 100 and illustrative solid state circuit package 101 in FIGS. 1A and 1B. Also, as discussed above, the PCB and the mold cap may be formed according to any technique compatible with PCB and solid state circuit package fabrication, as well as specific design requirements. Thus, for example, the number and arrangement of solid state packages of the PCB, and the number, locations and types of circuitry and/or electronic components (e.g., such as SMT devices, flip-chip devices and/or bond wire devices) of each solid state package, may vary without departing from the scope of the present teachings.

In block S212, one or more trenches are formed in the mold cap corresponding to desired locations of the EMI shields. Each of the trenches extends continuously from one edge of the mold cap to another edge of the mold cap, defining a trench pattern. The one or more trenches may be formed in the mold cap using laser ablation, for example, although other techniques for forming such trenches may be incorporated without departing from the scope of the present teachings.

Figure 3:
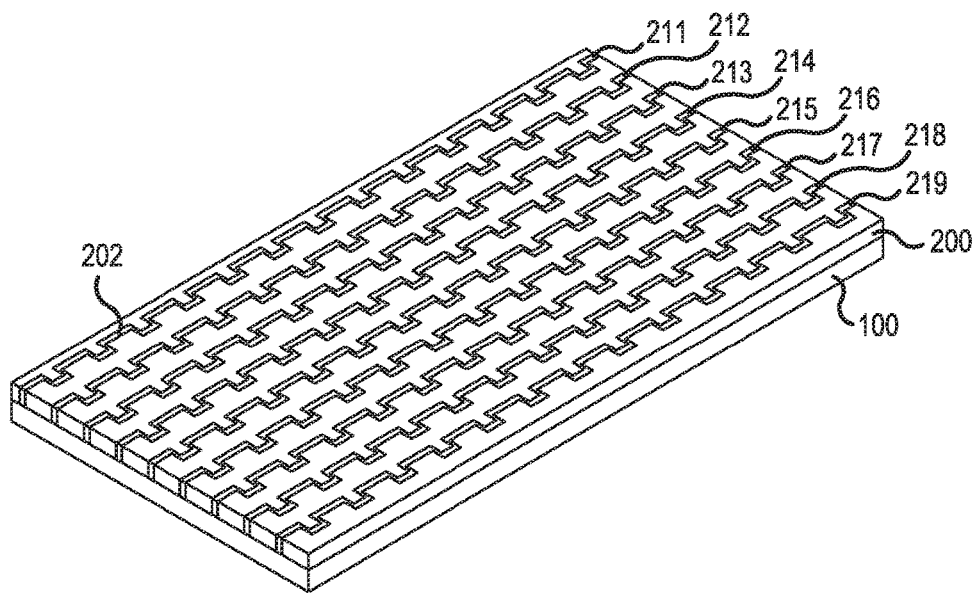
FIG. 3 is a top perspective view of a mold cap formed on a PCB, where continuous trenches have been formed from one edge of the mold cap to an opposite edge of the mold cap, according to a representative embodiment.

FIG. 3 is a top perspective view of a mold cap 200 formed on a PCB 100, where multiple continuous trenches have been formed from one edge (first edge) of the mold cap 200 to an opposite edge (second edge) of the mold cap 200, according to a representative embodiment. As mentioned above, the trenches may be formed using laser ablation, for example, indicated by arrow 202. Continuous trenches 211 through 219 are shown in the depicted embodiment, although more or fewer trenches may be included, as well as alternative designs, without departing from the scope of the present teaches. Each of the continuous trenches 211 through 219 extends from a top surface of the mold cap 200 to a top surface (e.g., top metal layer) of the PCB 100. In alternative configurations, the edges to which the trenches extend do not necessarily need to be opposite one another, as long as both ends of each of the trenches opens onto one of the edges of the mold cap 200.

In block S213, an elastomeric pad is sealed on a top surface of the mold cap to form multiple channels. In the depicted embodiment, the multiple channels comprise the trenches, respectively, formed in the mold cap in block S212, covered by the elastomeric pad. The elastomeric pad may be formed of various materials, such as rubber or synthetic silicon, for example, although any compatible material with elastomeric properties may be incorporated without departing from the scope of the present teachings.

As mentioned above, each of the channels comprises at least a corresponding trench formed in the mold cap. However, in an embodiment, a bottom surface of the elastomeric pad, which faces the top surface of the mold cap, includes multiple grooves that correspond to the multiple trenches in the mold cap, where the grooves effectively mirror the trench pattern defined by the trenches formed in the mold cap. In this case, each of the channels further comprises the groove included in the mold cap, along with the corresponding trench. In this case, the channels extend beyond the top surface of the mold cap into a portion of the elastomeric pad (created by the grooves). This feature is discussed below in more detail with reference to FIG. 7.

The elastomeric pad may be sealed to the mold cap using any compatible means, such as applying mechanical pressure to the elastomeric pad forcing it toward the top surface of the mold cap, or using locking levers that hook a "jig plate" under the PCB, for example. The elastomeric material properties of the elastomeric pad enable sealing of the trenches in the mold cap and/or grooves in a bottom surface of the elastomeric pad, except for the inlets and outlets at the mold cap edges.

Figure 4:
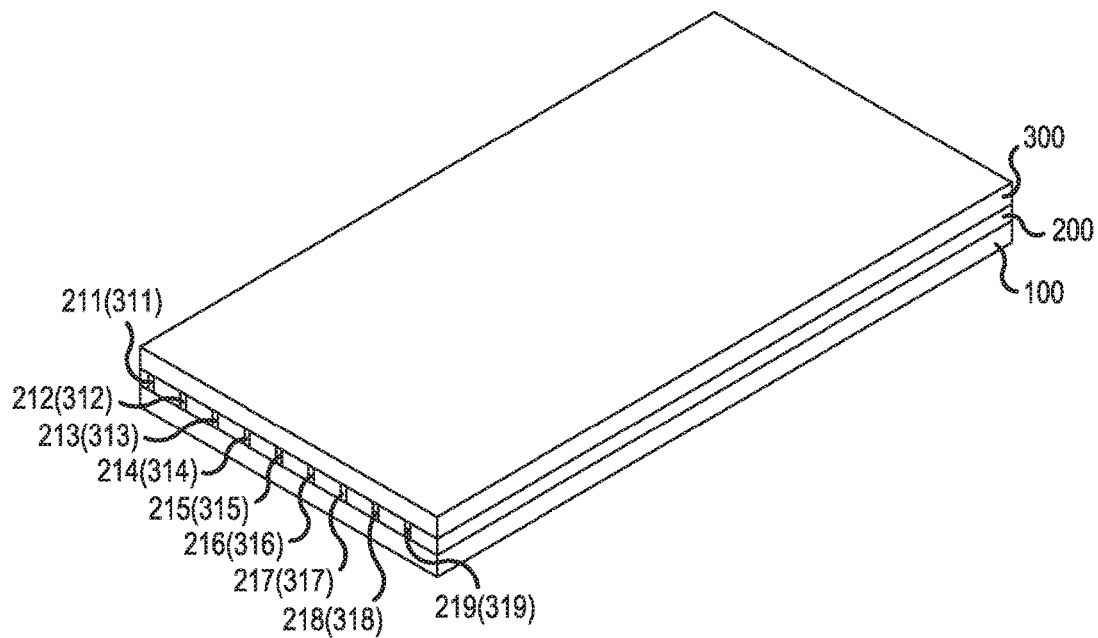
FIG. 4 is a top perspective view of an elastomeric pad sealed to a top surface of the mold cap formed on the PCB, according to a representative embodiment.

FIG. 4 is a top perspective view of an elastomeric pad 300 sealed to a top surface of the mold cap 200 formed on the PCB 100, according to a representative embodiment. The ends of the continuous trenches 211 through 219 are visible at the edge of the mold cap 200. In the depicted embodiment, the elastomeric pad 300 does not include any grooves on its bottom surface. Therefore, the channels formed by sealing the elastomeric pad 300 to the top surface of the mold cap 200, indicated as continuous channels 311 through 319, are the same as the continuous trenches 211 through 219.

In block S214, the channels formed by the elastomeric pad are filled with conductive epoxy using a vacuum. That is, the conductive epoxy is drawn through the channels from one edge (inlet) of the mold cap through the continuous trenches by a pressure differential created by a vacuum at another edge (outlet) (e.g., the opposite edge) of the mold cap. More particularly, the process of filling the channels includes connecting an epoxy dispenser to the one edge of the mold cap, activating a vacuum connected to the other edge of the mold cap, and injecting the conductive epoxy into the channels from the dispenser, e.g., in a liquid or viscous state. The activated vacuum draws the conductive epoxy through the channels, filling each of the channels with the conductive epoxy. The result is evenly dispersed conductive epoxy within the channels, with substantially no voids. Also, the conductive epoxy has been dispersed through all of the channels substantially simultaneously in a short amount of time, particularly relative to conventional dispensing needle techniques.

The vacuum may be provided in various ways, without departing from the scope of the present teachings. For example, an overflow chamber connected to the mold cap and/or the elastomeric pad (e.g., buffer chamber 341, discussed below) located at the outlet of the mold cap may be connected into a line vacuum or to a dedicated vacuum pump. Also, for example, the outlet side of the elastomeric pad, the mold cap and the PCB may be put into a vacuum chamber, while the inlet side remains at ambient pressure (or some higher pressure). A seal in between the two sides would maintain the vacuum, and thus preserve the pressure differential that causes the conductive epoxy to flow through the channels.

Figure 5A:
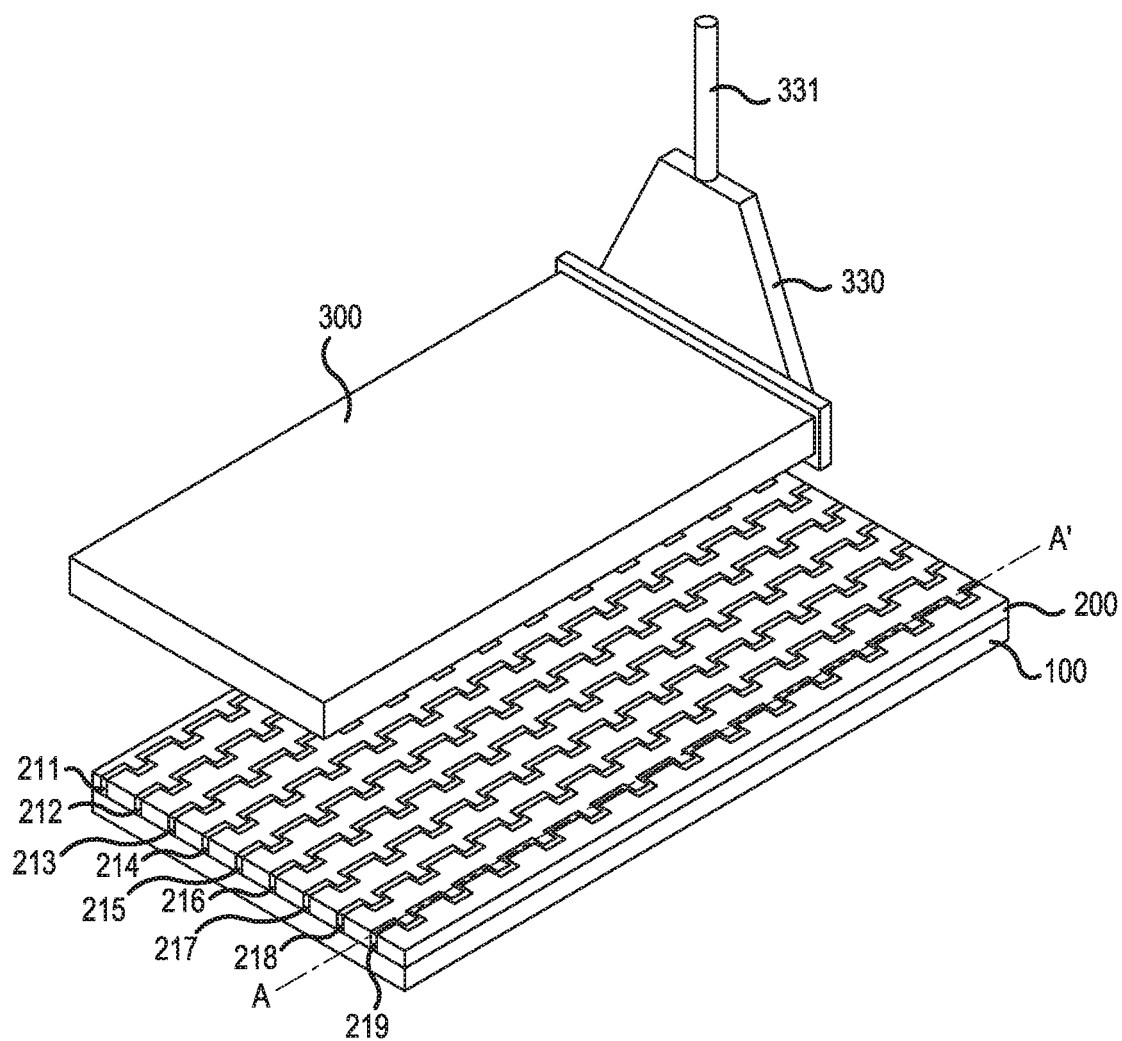
FIG. 5A is a top perspective view of an elastomeric pad, and epoxy dispenser, being sealed to the mold cap formed on the PCB, according to a representative embodiment.
Figure 5B:
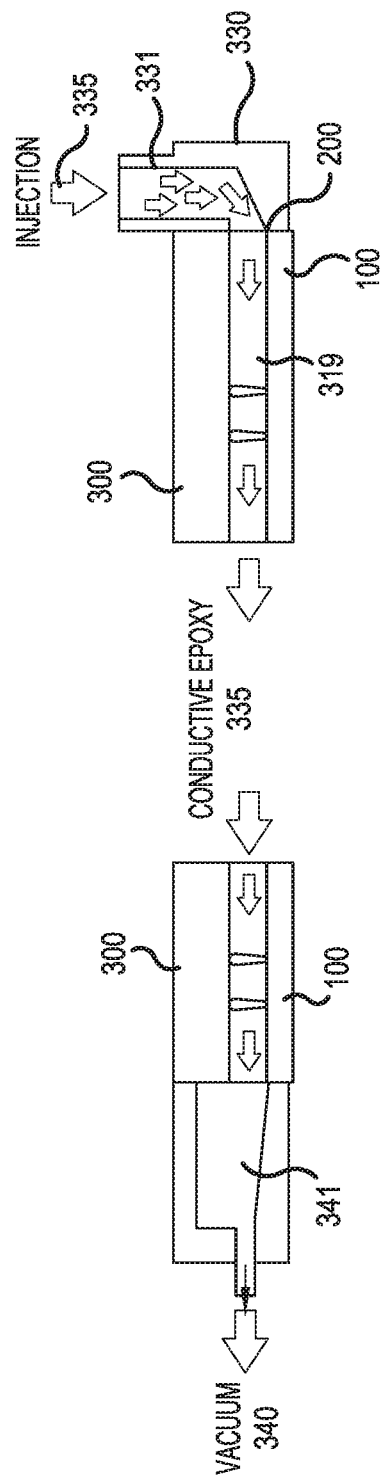
FIG. 5B is a simple cross-sectional view of FIG. 5A, taken along line A-A', showing the filling of an illustrative channel formed by the elastomeric pad and a trench in the mold cap, according to a representative embodiment.

FIG. 5A is a top perspective view of an elastomeric pad and epoxy dispenser being sealed to a mold cap with trenches, according to a representative embodiment, and FIG. 5B is a simple cross-sectional view of FIG. 5A, taken along line A-A', showing the filling of an illustrative channel formed by the elastomeric pad and a trench in the mold cap, according to a representative embodiment. Notably, FIG. 5B also shows the vacuum which draws the conductive epoxy through the channels formed at least in part by the trenches. The vacuum is not shown in FIG. 5A for the sake of convenience.

Referring to FIG. 5A, the elastomeric pad 300 is in the process of being applied (and sealed) to the top surface of the mold cap 200, as discussed above, and FIG. 5B shows the elastomeric pad 300 in place. Since the elastomeric pad 300 is not yet attached to the mold cap 200 in FIG. 5A, the continuous trenches 211-219 are shown in the mold cap 200 (which become continuous channels 311-319, respectively, after attachment of the mold cap 200, as shown in FIG. 5B). An epoxy dispenser 330 may be pre-attached to one end (first edge) of the elastomeric pad 300, and configured so that when the elastomeric pad 300 is sealed in place (as shown in FIG. 5B), the epoxy dispenser connects with the corresponding one end (first edge) of the mold cap 200, as well as the first edge of the elastomeric pad 300. In alternative embodiments, the epoxy dispenser 330 may not be pre-attached to the elastomeric pad 300, in which case the elastomeric pad 300 is applied and sealed to the mold cap 200 first, and the epoxy dispenser 330 is subsequently attached to both the mold cap 200 and the elastomeric pad 300.

Referring to FIG. 5B, the conductive epoxy 335 is injected into the representative channel 319 through conduit 331 attached to the epoxy dispenser 330. The conduit 331 may supply the conductive epoxy 335 from an epoxy reservoir (not shown) or other source, for example. Of course, other curable, flowable conductive materials, capable of EMI shielding, may be used in place of the conductive epoxy 335, without departing from the scope of the present teachings. As shown in FIG. 5A, the epoxy dispenser 330 is wide enough to cover the openings of all of the continuous channels 311-319. Therefore, the continuous channels 311-319 receive the conductive epoxy 335 substantially at the same time and at a substantially constant flow rate, in the manner shown with reference to the representative channel 319. As discussed above, the opposite end (second edge) of each of the mold cap 200 and the elastomeric pad 300 is connected to a vacuum 340 via a buffer chamber 341. The buffer chamber 341 provides an enlarged volume in which the conductive epoxy 335 collects to ensure that each of the continuous channels 311-319 completely fills with the conductive epoxy 335 before the remaining conductive epoxy 335 flows to a waste/recycle area (not shown) within the vacuum 340. An outer wall of the buffer chamber 341 also provides a seal against the second edge of each of the mold cap 200 and the elastomeric pad 300 to prevent leakage of the conductive epoxy 335 from the continuous channels 311-319 and/or air into the vacuum 340.

Figure 8A:
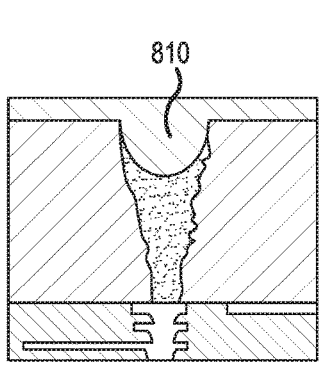
FIGS. 8A, 8B and 8C are cross-sections of mold caps showing examples of typical conductive epoxy defects in a portion of a conventional internal EMI shield.
Figure 8B:
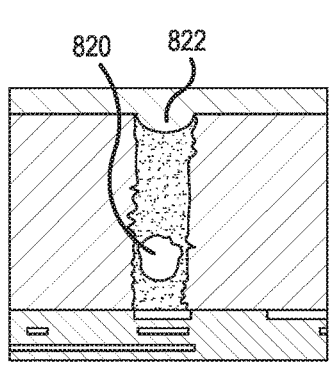
Figure 8C:
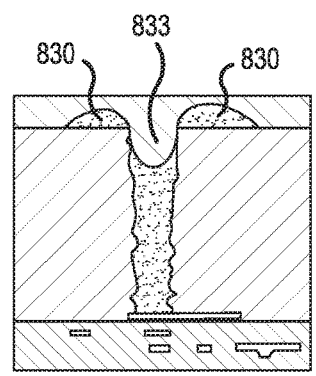

In this configuration, the vacuum 340 draws the conductive epoxy 335 from the epoxy dispenser 330, connected to the first edges of the mold cap 200 and the elastomeric pad 300, through the continuous channels 311-319 to the second edges of the mold cap 200 and the elastomeric pad 300 based on pressure differential. That is, the conductive epoxy 335 flows through the continuous channels 311-319 from the high pressure (e.g., ambient pressure) of the epoxy dispenser 330 to the low pressure of the vacuum 340. The sealed edges and substantially constant flow rate of the conductive epoxy 335 enables the channels to be filled, while reducing or substantially eliminating voids and/or overflow, such as epoxy void 820 in FIG. 8B and epoxy overflow 830 in FIG. 8C, discussed above.

In alternative embodiments, the pressure differential between the first and second edges of the mold cap 200 and the elastomeric pad 300 may be created by alternative means, such as a decreased air pressure at the second edges without necessarily creating a vacuum and/or increased air pressure at the first edges, without departing from the scope of the present teachings. For example, in an embodiment, the epoxy dispenser 330 may apply higher pressure (e.g., above ambient) to push the conductive epoxy 335 through the continuous channels 311-319, at the same time the vacuum 340 draws (pulls) the conductive epoxy. The technique ultimately applied, including the extent of the pressure differential, depends in part on the viscosity of the conductive epoxy 335 to be injected. Notably, if only pushing pressure at the inlet were used, it would be difficult to fill the entire lengths of the continuous channels 311-319, and may require very strong sealing at the first edges of the continuous channels 311-319. In comparison, applying the vacuum 340 at the outlet helps to more completely fill the continuous channels 311-319 within typical operating pressure ranges of dispensing devices. In addition, the vacuum 340 applied at the outlet is able to absorb air voids that could otherwise exist either inside the conductive epoxy 335 itself or be formed during injection, thereby providing high quality conductive epoxy 335 filling Referring again to FIG. 2, in block S215, the conductive epoxy (e.g., conductive epoxy 335) is cured to form the internal compartment EMI shields (e.g., illustrative internal EMI shield 122 shown in FIG. 1A). The conductive epoxy may be oven cured, where the conductive epoxy is set to form the compartment EMI shields by application of heat. However, any compatible curing process may be performed, including simply allowing the conductive epoxy to set over time, without departing from the scope of the present teachings. The compartment EMI shields resulting from the isolates at least one electronic component within a compartment surrounded by the compartment EMI shield.

In block S216, the elastomeric pad is removed from the top surface of the mold cap, and the PCB with the corresponding mold cap is singulated into solid state packages. The singulation may be performed by any compatible technique, such as scribe and break or laser ablation, for example, although other singulation techniques may be incorporated without departing from the scope or the present teachings. In block S217, an external EMI shield layer is applied on top and side outer surfaces of each of the solid state packages to form corresponding solid state modules. The external EMI shield layer may be an electrically conductive material, such as copper (Cu), silver (Ag), gold (Au), aluminum (Al), high permeability metal alloys (permalloys), or other metal, for example, applied using plating, sputtering or chemical vapor deposition (CVD) techniques, for example, although other application techniques may be incorporated without departing from the scope of the present teachings.

Figure 6A:
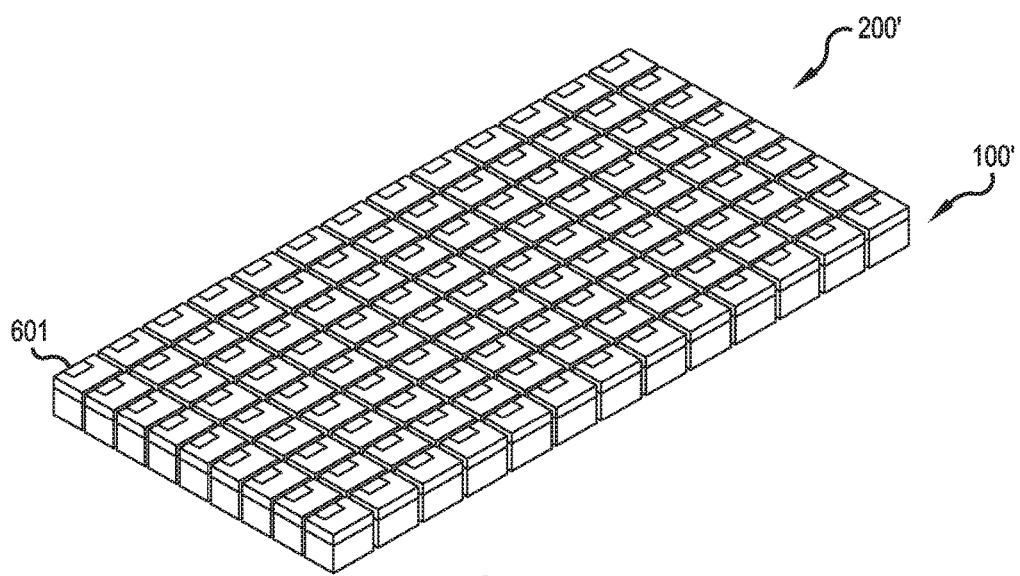
FIG. 6A is a top plan view of a PCB and corresponding mold cap singulated into multiple solid state circuit packages including EMI shields, respectively, according to a representative embodiment.
Figure 6B:
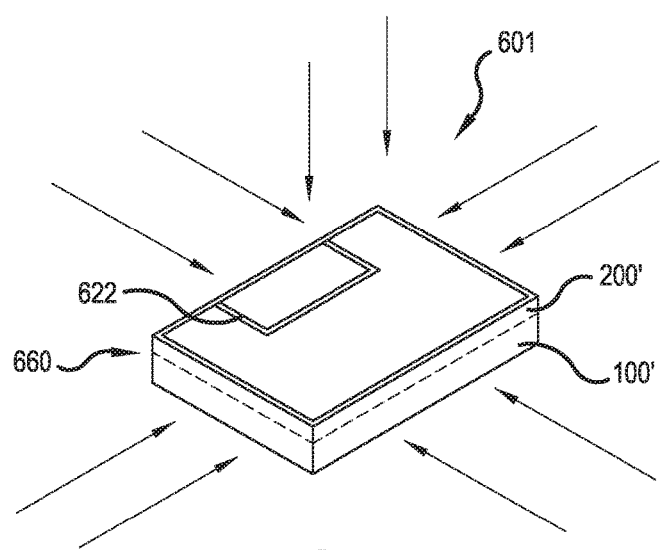
FIG. 6B is a top plan view of a representative solid state circuit package of the singulated PCB and corresponding mold cap shown in FIG. 6A, with an applied external EMI shield, according to a representative embodiment.

FIG. 6A is a top plan view of a PCB and corresponding mold cap singulated into multiple solid state circuit packages including EMI shields, respectively, according to a representative embodiment, and FIG. 6B is a top plan view of a representative solid state circuit package of the singulated PCB and corresponding mold cap shown in FIG. 6A, with an applied external EMI shield, according to a representative embodiment.

Referring to FIGS. 6A and 6B, the PCB 100 and corresponding mold cap 200 are shown singulated into multiple solid state circuits, such as representative solid state circuit 601, in which internal EMI shields have been formed, such as representative internal EMI shield 622. The singulated solid state circuits may be system-in-package (SiP) modules, for example, each SiP module including at least one internal EMI shield. In the depicted example, the solid state circuit 601 is one of 117 solid state circuits provided by singulating the PCB 100 and corresponding mold cap 200, each of which includes a portion of the singulated PCB 100' and corresponding portion of the singulated mold cap 200'. FIG. 6B, in particular, further shows application of electrically conductive material (indicated by arrows) on the top and side surfaces of the solid state circuit 601 to form an external EMI shield layer 660, thereby providing a shielded module. As mentioned above, the bottom of the solid state circuit 601 is protected from external EMI by the substrate of the portion of the singulated PCB 100' corresponding to the solid state circuit 601. In alternative embodiments, electrically conductive material may be applied to fewer than all four sides and/or the top of the solid state circuit 601, forming at least a partial external EMI shield layer, without departing from the scope of the present teachings.

For purposes of illustration, the solid state circuits are assumed to be identical with respect to circuitry, electronic components and numbers and locations of internal EMI shields, although the various embodiments are not limited thereto. For example, the solid state circuit 601 (as well as the other solid state circuits from the singulated PCB 100' and corresponding singulated mold cap 200') may have the same configuration as the solid state circuit package 101 shown in FIGS. 1A and 1B. However, arrangements of circuitry, electronic components and internal EMI shields may differ from that of the solid state circuit package 101, and/or the arrangements of circuitry, electronic components and internal EMI shields may differ among the solid state circuits singulated from the same PCB and corresponding mold cap, without departing from the scope of the present teachings.

In alternative embodiments, a bottom surface of the elastomeric pad, which faces a top surface of the mold cap on the PCB, includes grooves that mirror the trench pattern formed by the trenches in the mold cap. In this configuration, each channel that is ultimately filled with conductive epoxy comprises both the trench formed in the mold cap and the corresponding groove formed in the elastomeric pad.

Figure 7:
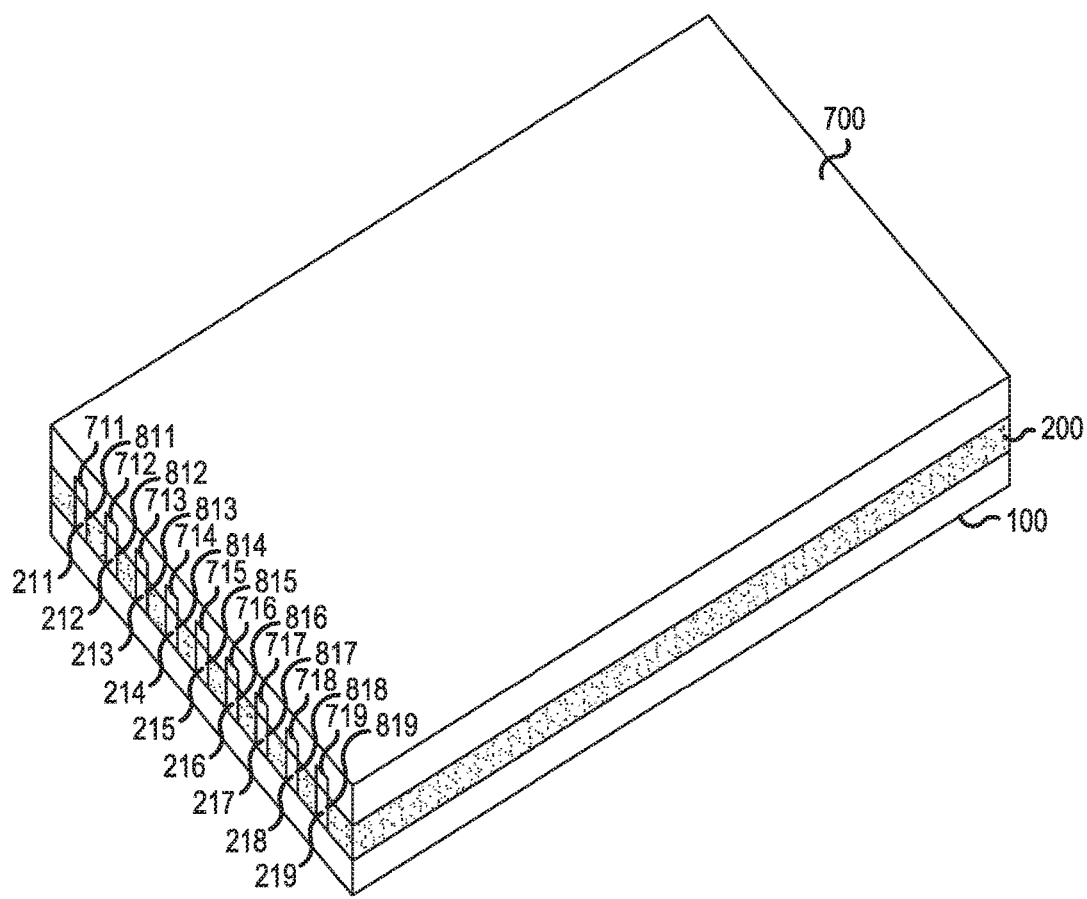
FIG. 7 is a top perspective view of an elastomeric pad sealed to a top surface of a mold cap formed on a PCB, where continuous grooves have been formed in the elastomeric pad corresponding to continuous trenches formed in the mold cap, forming corresponding channels, according to a representative embodiment.

For example, FIG. 7 is a top perspective view of an elastomeric pad sealed to a top surface of a mold cap formed on a PCB, where continuous grooves have been formed in the elastomeric pad corresponding to continuous trenches formed in the mold cap, forming corresponding channels, according to a representative embodiment.

Referring to FIG. 7, the mold cap 200 is formed on the PCB 100, where continuous trenches 211-219 have been formed from one edge (first edge) of the mold cap 200 to an opposite edge (second edge) of the mold cap 200, as discussed above with reference to FIGS. 3-5A. More or fewer trenches may be included, as well as various alternative designs, without departing from the scope of the present teaches. The ends of the continuous trenches 211 through 219 are visible at the second edge of the mold cap 200.

Further, in the depicted embodiment, an elastomeric pad 700 is shown sealed to the top surface of the mold cap 200.

The elastomeric pad 700 is substantially the same as the elastomeric pad 300, discussed above (including connections to the epoxy dispenser 330 and the vacuum 340), except that the elastomeric pad 700 includes continuous grooves 711-719 that correspond to the continuous trenches 211-219 included in the mold cap 200. In other word, the continuous grooves 711-719 mirror the trench pattern formed in the mold cap 200 by the trenches 211-219. Thus, the continuous grooves 711-719 and the trenches 211-219 effectively align to create continuous channels 811-819, respectively, after attachment of the elastomeric pad 700 to the mold cap 200, as shown in FIG. 7. Stated differently, the channel 811 comprises the trench 211 and the groove 711, the channel 812 comprises the trench 212 and the groove 712, the channel 813 comprises the trench 213 and the groove 713, the channel 814 comprises the trench 214 and the groove 714, the channel 815 comprises the trench 215 and the groove 715, the channel 815 comprises the trench 215 and the groove 715, the channel 816 comprises the trench 216 and the groove 716, the channel 817 comprises the trench 217 and the groove 717, the channel 818 comprises the trench 218 and the groove 718, and the channel 819 comprises the trench 219 and the groove 719.

Injection and flow of the conductive epoxy 335 through the continuous channels 811-819 function based on pressure differential functions substantially the same as discussed above with reference to continuous channels 311-319 in FIGS. 5A and 5B, above. However, the conductive epoxy 335 may shrink during the oven curing process, depending for example on the epoxy material, the applied temperature, and the curing time. The additional portion of conductive epoxy 335 in the continuous grooves 711-719 compensates for the anticipated shrinkage, such that the resulting internal EMI shields (e.g., representative internal EMI shields 122 and 622) have top edges that are substantially flush with the top surface of the mold cap 200. In other words, the presence of the additional conductive epoxy 335 in the continuous grooves 711-719 reduces or substantially eliminates dimpling of the internal EMI shields, such as epoxy dimple 810 in FIG. 8A, discussed above, that may otherwise result from oven curing.

Figure 9A:
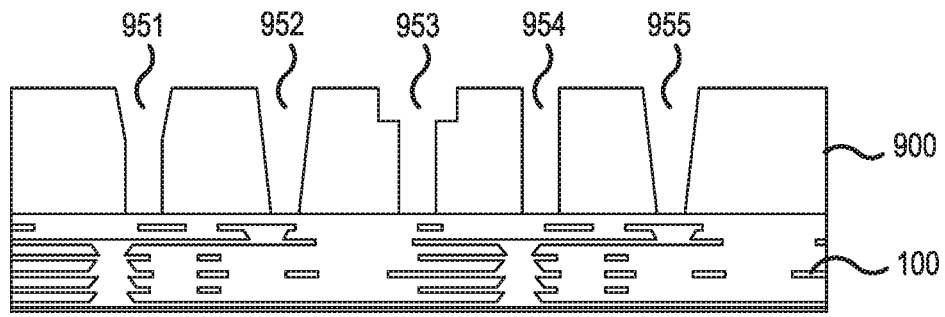
FIGS. 9A and 9B are simple cross-sectional views of trench and channel shapes in mold caps formed on a PCB, according to representative embodiments.
Figure 9B:
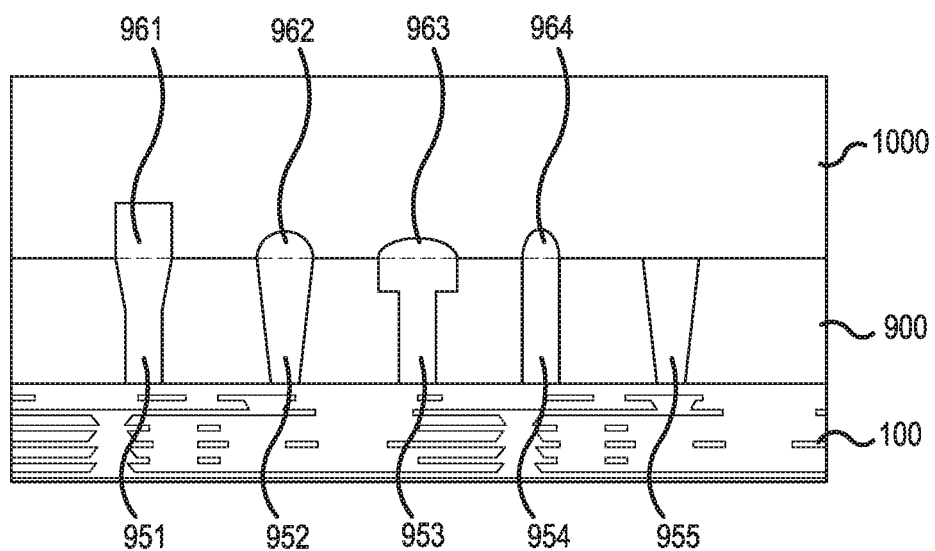

FIGS. 9A and 9B are simple cross-sectional views of trench and channel shapes in mold caps formed on a PCB, according to representative embodiments. The depicted variety of cross-sectional shapes is possible through the use of laser ablation, for example (e.g., as opposed to conventional dispensing needles).

Referring to FIG. 9A, five illustrative cross-sectional shapes are shown of trenches in a mold cap 900 formed on the PCB 100. For example, trench 951 is "V-2shaped," trenches 952 and 955 are "Y-shaped," trench 953 is "T-shaped," and trench 954 is straight. Of course, trenches may have various other shapes without departing from the scope of the present teachings. Referring to FIG. 9B, an elastomeric pad 1000 is formed on the mold cap 900, and includes illustrative cross-sectional shapes of grooves corresponding to some of the trenches in the mold cap 900. In particular, the elastomeric pad 1000 includes square groove 961 corresponding to the trench 951 to form a channel 1051. The elastomeric pad 1000 also includes rounded grooves 962, 963 and 964 corresponding to the trenches 952, 953 and 954 to form channels 1052, 1053 and 1054, respectively. The trench 955 does not have a corresponding groove in the elastomeric pad 1000, so the channel 1055 includes only the trench 955. Grooves may likewise have various other shapes without departing from the scope of the present teachings.

The various components, structures, parameters and methods are included by way of illustration and example only and not in any limiting sense. In view of this disclosure, those skilled in the art can implement the present teachings in determining their own applications and needed components, materials, structures and equipment to implement these applications, while remaining within the scope of the appended claims.

What is claimed:

1. A method of forming an internal electromagnetic interference (EMI) shield in a mold cap formed over a printed circuit board (PCB), the method comprising:
    forming a trench in the mold cap, the trench extending continuously from a first edge of the mold cap to a second edge of the mold cap, wherein the trench defines a trench pattern corresponding to desired locations of the internal EMI shield;
    sealing an elastomeric pad on a top surface of the mold cap to form a channel, the channel comprising at least the trench formed in the mold cap; and
    filling the channel with a conductive epoxy using a pressure differential to draw the conductive epoxy from a dispenser, connected to the first edge of the mold cap, through the channel to the second edge of the mold cap.

2. The method of claim 1, wherein the trench is formed from a top surface of the mold cap to a top metal layer of the PCB.

3. The method of claim 1, wherein a bottom surface of the elastomeric pad, which faces the top surface of the mold cap, includes a groove that mirrors the trench pattern formed in the mold cap, and
    wherein the groove included in the mold cap is also filled with the conductive epoxy when filling the channel with the conductive epoxy.

4. The method of claim 3, further comprising:
    curing the conductive epoxy in an oven.

5. The method of claim 4, wherein shrinkage of the conductive epoxy resulting from the curing is compensated for by a portion of the conductive epoxy filling the groove in the bottom surface of the elastomeric pad, thereby reducing dimpling of the conductive epoxy within the trench.

6. The method of claim 1, wherein forming the trench in the mold cap comprises laser ablation.

7. The method of claim 1, wherein the elastomeric pad comprises at least one of rubber or silicon.

8. The method of claim 1, wherein the internal EMI shield is a compartment EMI shield.

9. The method of claim 8, further comprising:
    removing the elastomeric pad; and
    singulating the PCB into a plurality of solid state circuit packages, one solid state circuit package of the plurality of solid state circuit packages including the compartment EMI shield.

10. The method of claim 9, further comprising:
    applying an external EMI shield layer on outer surfaces of the one solid state circuit package including the compartment EMI shield to form a shielded module.

11. The method of claim 10, wherein at least the one shielded module including the compartment EMI shield comprises a system-in-package (SiP) module.

12. A method of forming a compartment electromagnetic interference (EMI) shield in a mold cap formed over a printed circuit board (PCB), the method comprising:
    forming a trench in the mold cap extending continuously from a first edge to a second edge of the mold cap, the trench corresponding to a desired location of the compartment EMI shield;
    sealing an elastomeric pad on a top surface of the mold cap to form a channel comprising at least the trench formed in the mold cap;
    activating a vacuum pump connected to a chamber to which the second edge of the mold cap is connected;
    injecting a conductive epoxy into the channel from a dispenser connected to the first edge of the mold cap, wherein the activated vacuum pump draws the conductive epoxy through the channel to the second edge of the mold cap, filling the channel with the conductive epoxy;
    curing the conductive epoxy; and
    removing the elastomeric pad from the top surface of the mold cap.

13. The method of claim 12, wherein a bottom surface of the elastomeric pad, which faces the top surface of the mold cap, includes a groove that mirrors the trench formed in the mold cap, and
    wherein the groove included in the mold cap is also filled with the conductive epoxy when filling the channel with the conductive epoxy.

14. The method of claim 13, wherein shrinkage of the conductive epoxy resulting from the curing of the conductive epoxy is compensated for by a portion of the conductive epoxy filling the groove in the bottom surface of the elastomeric pad, thereby reducing or substantially eliminating dimpling of the conductive epoxy within the trench.

15. A method of forming compartment electromagnetic interference (EMI) shields in a mold cap formed over a printed circuit board (PCB), the method comprising:
    forming a plurality of trenches in the mold cap corresponding to desired locations of the compartment EMI shields, each of the plurality of trenches extending continuously from a one edge of the mold cap to another edge of the mold cap;
    sealing an elastomeric pad on a top surface of the mold cap to form a plurality of channels comprising at least the plurality of trenches, respectively;
    activating a vacuum to which the one edge of the mold cap is connected;
    injecting a conductive epoxy into the plurality of channels from a dispenser connected to the another edge of the mold cap, wherein the activated vacuum draws the conductive epoxy through the plurality of channels, filling each of the plurality of channels with the conductive epoxy; and
    curing the conductive epoxy to form the compartment EMI shields, each of the compartment EMI shields isolating at least one electronic component within a compartment surrounded by the compartment EMI shield.

16. The method of claim 15, further comprising:
    removing the elastomeric pad from the top surface of the mold cap; and
    singulating the PCB to form a plurality of system-in-package (SiP) modules, each SiP module including at least one of the compartment EMI shields.

17. The method of claim 16, further comprising:
    applying an external EMI shield layer on at least one of top and side outer surfaces of each SiP module of the plurality of SiP modules.

18. The method of claim 15, wherein a bottom surface of the elastomeric pad, which faces a top surface of the mold cap, includes a plurality of grooves corresponding to the plurality of trenches formed in the mold cap, and
wherein the plurality of channels further comprise the plurality of grooves in the bottom surface of the elastomeric pad, respectively channel.

19. The method of claim 18, wherein curing the conductive epoxy comprises oven curing, and
wherein shrinkage of the conductive epoxy in the plurality of channels resulting from the curing is compensated for by portions of the conductive epoxy filling the plurality of grooves in the bottom surface of the elastomeric pad, thereby reducing dimpling of the conductive epoxy within the plurality of trenches, respectively.

20. The method of claim 15, wherein forming the plurality of trenches in the mold cap comprises laser ablation.

* * * * *